United States Patent [19]

Matsumura

[11] Patent Number: 4,485,121
[45] Date of Patent: Nov. 27, 1984

[54] METHOD FOR PRODUCING A FLUORINE-CONTAINING AMORPHOUS SEMICONDUCTOR

[75] Inventor: Hideki Matsumura, Tokyo, Japan

[73] Assignee: Tokyo Institute of Technology, Tokyo, Japan

[21] Appl. No.: 503,088

[22] Filed: Jun. 10, 1983

[30] Foreign Application Priority Data

Jun. 16, 1982 [JP] Japan ............... 57-101970

[51] Int. Cl.³ .............................. B05D 3/06
[52] U.S. Cl. ..................... 427/39; 427/87; 427/95
[58] Field of Search ............. 427/39, 87, 95

[56] References Cited

U.S. PATENT DOCUMENTS 4,226,898 10/1980 Ovshinsky et al. .......... 427/87 X

Primary Examiner—Bernard D. Pianalto
Attorney, Agent, or Firm—Burns, Doane, Swecker & Mathis

[57] ABSTRACT

Production of fluorine-containing amorphous semiconductors having high thermal stability, photoconductivity and photosensitivity by decomposing a mixed gas of silicon difluoride gas or silicon monofluoride gas with hydrogen gas or hydrogen atom gas, or $SiFH_3$ gas or $SiF_2H_2$ gas with electric discharge and depositing the decomposed gas on a substrate.

7 Claims, 3 Drawing Figures

METHOD FOR PRODUCING A FLUORINE-CONTAINING AMORPHOUS SEMICONDUCTOR

BACKGROUND OF THE INVENTION

1. Field of the Invention:

The present invention relates to a method for producing a fluorine-containing amorphous semiconductor, particularly a fluorine-containing amorphous silicon, silicon carbide, silicon germanium or other amorphous semiconductors.

2. Description of the Prior Art:

Recently, fluorine-containing amorphous semiconductors have been noticed to solar cell and other various uses.

Heretofore, fluorine-containing amorphous semiconductors have been produced by decomposing either of mixed gases of silicon tetrafluoride $SiF_4$ gas with hydrogen gas or silicon tetrafluoride gas with silane ($SiH_4$) gas, with glow discharge as described in U.S. Pat. No. 4,226,898. However, the production method of this prior art has a defect that the incorporation of fluorine into the amorphous semiconductor cannot be satisfactorily controlled, so that even though fluorine which is high in the bonding energy to silicon and should be inherently stable, is contained, the thermal stability is not improved as compared with that of the prior amorphous semiconductors which do not contain fluorine and further the electrooptical properties, such as the photoconductivity and photosensitivity are equal to or rather inferior to those of the prior amorphous semiconductors not containing fluorine.

SUMMARY OF THE INVENTION

The present invention aims at the production of amorphous semiconductors, such as amorphous silicon having high thermal stability, that is high heat resistance by containing fluorine in an amorphous semiconductor in a high controllability in an ideal form, whereby the inherent feature of fluorine is utilized.

The present invention lies in a method for producing a fluroine-containing amorphous semiconductor which comprises mixing silicon difluoride $SiF_2$ gas or silicon monofluoride SiF gas with hydrogen ($H_2$) gas or hydrogen atom (H) gas, decomposing the mixed gas by electric discharge and depositing the decomposed gas on a substrate to form the fluorine-containing amorphous semiconductor. In this case, instead of the mixture of silicon difluoride gas or silicon monofluoride gas with hydrogen gas or hydrogen atom gas, $SiFH_3$ gas or $SiF_2H_2$ gas may be used as the starting gas.

According to the present invention, an amorphous semiconductor not having the above described defect can be obtained by using the mixed gas of silicon difluroide $SiF_2$ gas which is unstable at room temperature and under atmospheric pressure and therefore is not present in natural form but is very active and has a short life and possibility that fluorine can be incorporated in high controllability, or silicon monofluoride SiF which is a fragment thereof, with hydrogen gas or hydrogen atom gas, as a main component of a material gas.

DESCRIPTION OF THE PREFERRED EMBODIMENTS

The amorphous semiconductors produced by the method of the present invention include a fluorine-containing amorphous silicon or semiconductors in which a fluorine-containing amorphous silicon is a basic skeleton which contains other elements therein, for example, fluorine-containing amorphous silicon carbide or amorphous silicon germanium.

The decomposing deposit may be carried out by glow discharge process, discharge process which does not cause glow, arc discharge process or CVD process. CVD process is somewhat low in the depositing speed.

The temperature of the substrate upon depositing is about 250°–600° C. In the present invention, $SiF_2$ is used, so that it is possible to use the substrate temperature which is higher than about 500° C. In the present invention, the depositing speed for obtaining the amorphous semiconductor having the same quality as the case using $SiF_4$ is very rapid as high as 2–3 times as compared with the case using $SiF_4$.

The amorphous semiconductors produced by the method of the present invention can be used for solar cell, photosensor for facsimile, photosensitive material for electrophotography, photosensitive material for television camera, thin film transistor and the like.

In one embodiment of the method of the present invention, silicon difluoride $SiF_2$ is mixed with hydrogen to prepare a base gas, said gas is decomposed with a high frequency glow discharge and an amorphous silicon semmiconductor is deposited on a substrate. In this embodiment, solid silicon and silicon tetrafluoride $SiF_4$ gas are heated in an electric furnace to generate silicon difluoride $SiF_2$ through a chemical reaction formula of $SiF_4+Si \rightarrow 2SiF_2$. A diagrammatic view of an apparatus in this case is shown in FIG. 1.

Figure 1:
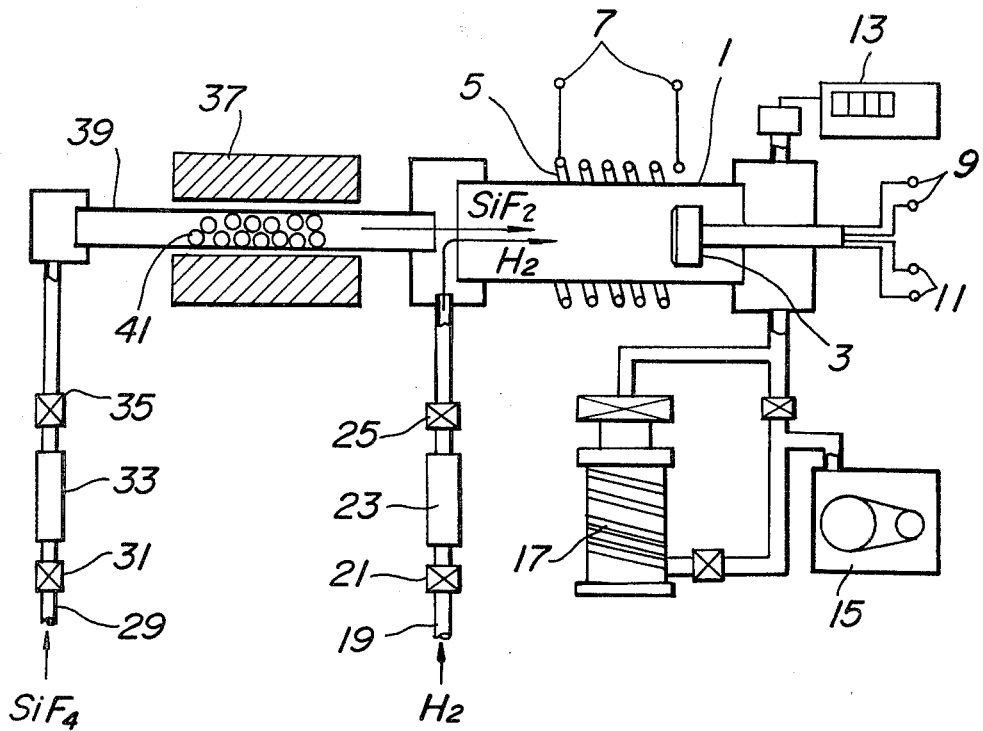
FIG. 1 is a diagrammatic illustration of an apparatus for carrying out the method of the present invention.

In the embodiment of operation of the apparatus shown in FIG. 1, a high frequency glow discharge apparatus 1 is used as a furnace for producing the amorphous semiconductor, 120 sc cm (1 sc cm: an amount of gas flowed of 1 cc per minute in pressure difference of 1 atm) of hydrogen is introduced into said glow discharge apparatus 1 from an inlet tube 19 and at least 10 sc cm of $SiF_2$ is fed from an outlet end positioned at right side of a quartz tube 39. When a temperature of an electric furnace 37 is 1,150° C., if 10 sc cm of $SiF_4$ is introduced therein from an inlet end positioned at left side of the quartz tube 39, 10 sc cm or more of $SiF_2$ is generated in the electric furnace 37 and fed into the high frequency glow discharge apparatus 1. In the high frequency glow discharge apparatus 1, a frequency having 13.65 MHz and a power of 25–30 W is flowed into a high frequency coil 5 from an input terminal 7. When a substrate 3 has been heated at about 500° C., an amorphous silicon semiconductor is deposited at a growing rate of 5–10 Å/sec on the substrate 3.

Figure 2:
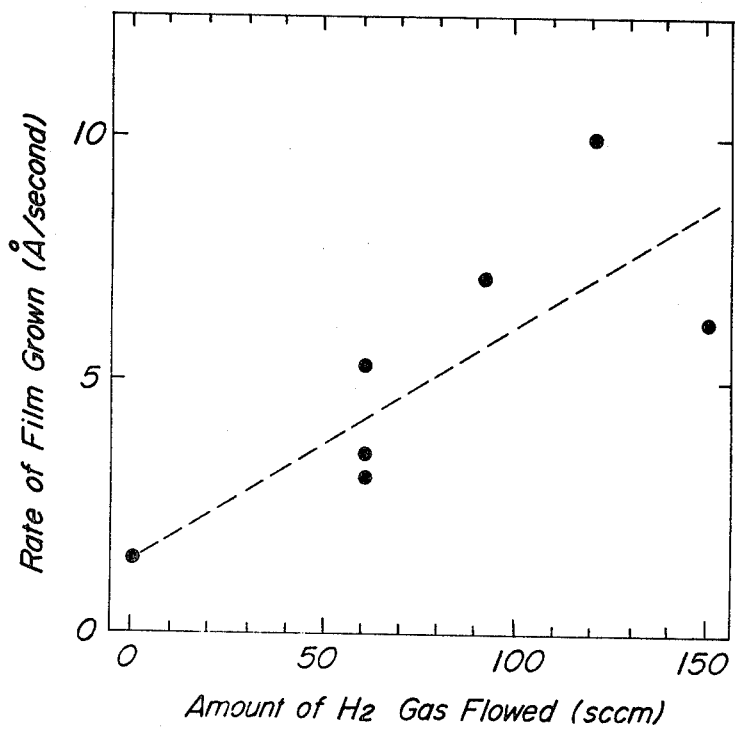
FIG. 2 is a graph showing the relation of an amount of hydrogen gas flowed to a rate of the film grown.

According to the method of the present invention, an amorphous semiconductor may be stably deposited at a relatively high growing rate. FIG. 2 shows a rate of amorphous silicon deposited when about 10 sc cm or more of $SiF_2$ (an amount of $SiF_4$ flowed: 10 sc cm) is flowed and an amount of $H_2$ flowed is varied by means of the apparatus of FIG. 1. The temperature Ts of the substrate is 500° C., the high frequency power is 30 W, the gas pressure Pg in the apparatus 1 is about 0.1 Torr (0.1 mmHg). When an amount of $H_2$ flowed is more than 100 sc cm, the growing rate is about 5-10 Å/sec.

Figure 3:
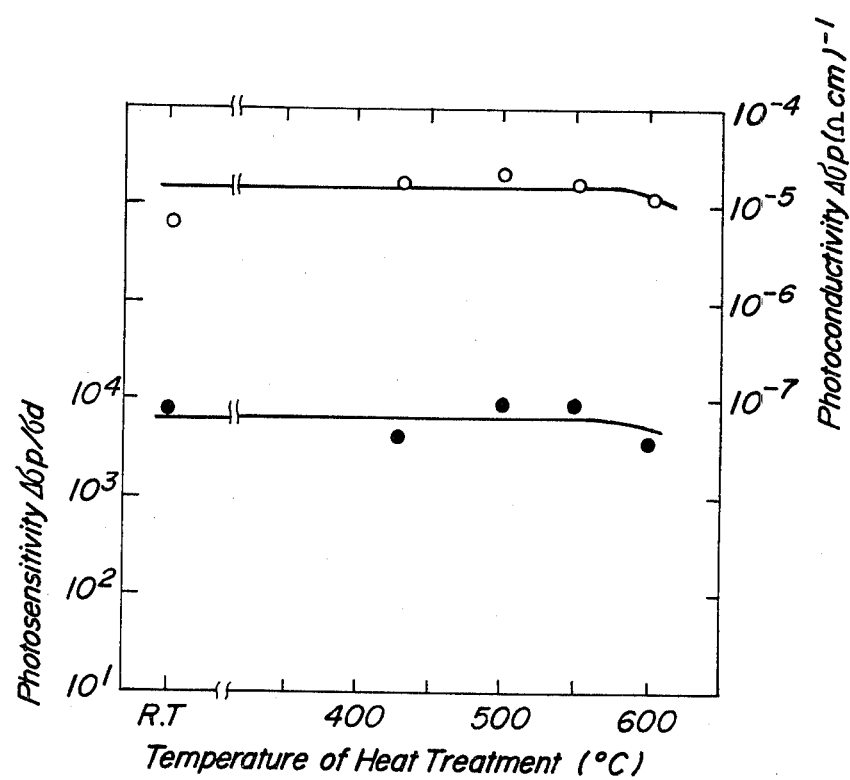
FIG. 3 is graphs showing the relation of the heat treating temperature to the photoconductivity and the photosensitivity.

Even though the amorphous silicon according to the method of the present invention if formed in a relatively high growing rate, the amorphous silicon has high heat resistance and photoconductivity, and the photoconductivity is not deteriorated even after the heat treatment at a temperature of higher than 500° C. under vacuum. As an example thereof, FIG. 3 shows the variation of the photoconductivity $\Delta\sigma_p(\Omega cm)^{-1}$ (blank mark) and the photosensitivity ($\Delta\sigma_p/\sigma_d$, $\sigma_d$: dark conductivity, black mark) when the amorphous silicon produced at an amount of $H_2$ flowed of 120 sc cm is subjected to heat treatment under vacuum. The conditions for producing the sample other than the amount of hydrogen flowed are the same as those in FIG. 2. The photoconductivity was measured by He.Ne laser beam of 1 mW/cm². As shown in FIG. 3, the properties are not substantially deteriorated after the heat treatment at a temperature of higher than 500° C. Furthermore, the diffusion of impurities in the amorphous semiconductors produced by the method of the present invention is prevented. When a conventional amorphous silicon containing only hydrogen is applied to a solar cell, the properties are deteriorated with lapse of time due to diffusion of electrode metal and diffusion of p- or n-type dopants and the amorphous silicon is unstable and poor in the weather resistance. In the amorphous silicon according to the present invention, the heat resistance is very high and the diffusion of the electrode metal and p- or n-type dopants is controlled, so that the defects in view of the deterioration with lapse of time, the unstability and the weather resistance are solved. Furthermore, the present invention can produce very rapidly fluorine-containing semiconductors having high quality. Accordingly, the method of the present invention is very high in the practical value and very commercially valuable.

What is claimed is:

1. A method for producing a fluorine-containing amorphous semiconductor, which comprises decomposing a mixed gas obtained by mixing silicon difluoride $SiF_2$ gas or silicon monofluoride SiF gas with hydrogen ($H_2$) gas or hydrogen atom (H) gas, or $SiFH_3$ gas or $SiF_2H_2$ gas with electric discharge and depositing the decomposed gas on a substrate to form a fluorine-containing amorphous semiconductor.

2. The method as claimed in claim 1, wherein the formed fluorine-containing amorphous semiconductor is fluorine-containing amorphous silicon.

3. The method as claimed in claim 1, wherein the formed fluorine-containing amorphous semiconductor is a semiconductor in which fluorine-containing amorphous silicon is a basic skeleton and other elements are contained in the basic skeleton.

4. The method as claimed in claim 3, wherein said fluorine-containing amorphous semiconductor is fluorine-containing amorphous silicon carbide or amorphous silicon germanium.

5. The method as claimed in claim 1, wherein the decomposition is carried out at a temperature of about 250°-600° C.

6. The method as claimed in claim 5, wherein the decomposition temperature is about 250°-500° C.

7. The method as claimed in claim 5, wherein the decomposition temperature is about 500°-600° C.

* * * * *